United States Patent [19]

Cruz et al.

[11] Patent Number: 4,525,641

[45] Date of Patent: Jun. 25, 1985

[54] FLIP-FLOP PROGRAMMER USING CASCADED LOGIC ARRAYS

[75] Inventors: Claude A. Cruz, Fremont, Calif.; Johannes C. Vermeulen, Longmont, Colo.

[73] Assignee: International Business Machines Corporation, Armonk, N.Y.

[21] Appl. No.: 448,652

[22] Filed: Dec. 10, 1982

[51] Int. Cl.$^3$ .................. H03K 19/173; H03K 3/027
[52] U.S. Cl. ............................... 307/465; 307/272 R; 307/445; 364/716; 377/54
[58] Field of Search ........ 307/440, 445, 463, 465–469, 307/272 R; 364/716; 377/54

[56] References Cited

U.S. PATENT DOCUMENTS 3,566,153  2/1971  Spencer, Jr. ................... 364/716 X
3,993,919  11/1976 Cox et al. .......................... 307/279
4,034,356  7/1977  Howley et al. ................... 307/465
4,267,463  5/1981  Mayumi ............................. 307/445

FOREIGN PATENT DOCUMENTS 165031  12/1980  Japan .................................. 307/465

OTHER PUBLICATIONS

Long, "Input Bus Switching for PLA"; *IBM Tech. Discl. Bull.;* vol. 20, No. 3, p. 1062; 8/1977.
O'Hara, Jr., "PLA Multifunction Latches"; *IBM Tech. Discl. Bull.;* vol. 20, No. 12, pp. 5205–5208; 5/1978.
Greenspan, "Multiple Partioned Programmable Logic Array"; *IBM Tech. Discl. Bull.;* vol. 19, No. 5; pp. 1780–1781; 10/1976.
Mitchell, "Programmable Logic Arrays"; *Electronic Design,* 15, 7/19/76; pp. 98–101.
IBM Technical Disclosure Bulletin, "Programmable Flip-Flop", J. E. Gersbach, vol. 18, No. 5, Oct. 1975.
IBM Technical Disclosure Bulletin, "PLA Having OR-Array Bit Partitioning", L. D. Whitley, vol. 24, No. 6, Nov. 1981.

*Primary Examiner*—Larry N. Anagnos
*Attorney, Agent, or Firm*—Carl M. Wright; Homer L. Knearl

[57] ABSTRACT

Cascaded programmable logic arrays are used to program any type of flip-flop. The latch itself can be embedded in the array when using cascaded PLA's. The arrays can be cascaded to provide logic functions using less total area than a single array embodying the same function.

3 Claims, 8 Drawing Figures

| A | B | C | D | X | Y | Z |
|---|---|---|---|---|---|---|
| X | 1 | 0 | X | 1 | 0 | 0 |
| X | 1 | X | 1 | 1 | 0 | 0 |
| 1 | 0 | X | X | 0 | 1 | 1 |
| 0 | 1 | X | X | 0 | 1 | 0 |
| X | 1 | 1 | 1 | 0 | 0 | 1 |

FLIP-FLOP PROGRAMMER USING CASCADED LOGIC ARRAYS

TECHNICAL FIELD

This invention relates to the fabrication of latch types using programmable logic arrays (PLA's), and particularly, to the use of more than one PLA in cascade to fabricate any type of flip-flop.

Latches coupled to PLA's are commercially available but are limited as to type, and, being integrated on a chip, cannot be changed by the user after initial selection.

Latches can be fabricated, or embedded, in PLA's using suitable feedback couplings but for specifically configured arrays, e.g., counters, the array is large and uneconomical. The response times are limited because of the increased stray capacitance associated with large arrays.

BACKGROUND ART

Configuring a PLA to "personalize" sequential and latching operations is used in the digital circuit art to reduce component count and to provide flexibility.

One example is shown in "Programmable Flip-Flop," J. E. Gersbach, *IBM Technical Disclosure Bulletin,* Vol. 18, No. 5, Oct. 1975, pp. 1323–1324. Although directed to teaching enhancements of PLA circuits by inserting a two-bit decoder between the PLA's OR array output and the controlled output register, it is typical of the prior art programming of latches using single level PLA's. A somewhat similar arrangement is shown in "PLA Having OR-Array Bit Partitioning," L. D. Whitley, *IBM Technical Disclosure Bulletin,* Vol. 24, No. 6, Nov. 1981, pp. 2747–2748.

U.S. Pat. No. 3,993,919 shows a PLA chip with latches included on the chip and represents a typical prior art approach using a single PLA comprising an AND array and an OR array with feedback coupling from the latch.

The cited prior art possesses limitations that result from the use of a single PLA.

DISCLOSURE OF THE INVENTION

In accordance with the present invention, a flip-flop of at least one type supplies output signals to first and second programmable logic arrays and receives as input signals the output signals from the programmable logic arrays. The output signals from the first programmable logic array supply input signals to the second programmable logic array.

This arrangement using cascaded PLA's provides more flexibility to synthesize any type flip-flop. It also allows dynamic alteration of latch behavior under control of the main logic array. It also provides the capability of determining the active output level and of selecting for each output the dominant, i.e., overriding input.

In some cases, it permits a simpler code selection.

In the limiting case, the fixed latch circuits can be embedded in the latch control array.

The described use of cascaded PLA's relieves the designer from significant constraints.

The resulting cascaded array configuration usually has less combined area than that of a single large array required to perform a similar function. Since each cascaded array is much smaller, there is less stray capacitance and the signals' transition times are thus improved, increasing the overall speed of operation over that of a single, large array.

The use of an additional array reduces the number of word lines used in the PLA's. In some large arrays, the total number of word lines is so high as to be impractical, or even impossible, to implement.

DESCRIPTION OF THE PREFERRED EMBODIMENT

Figure 1:
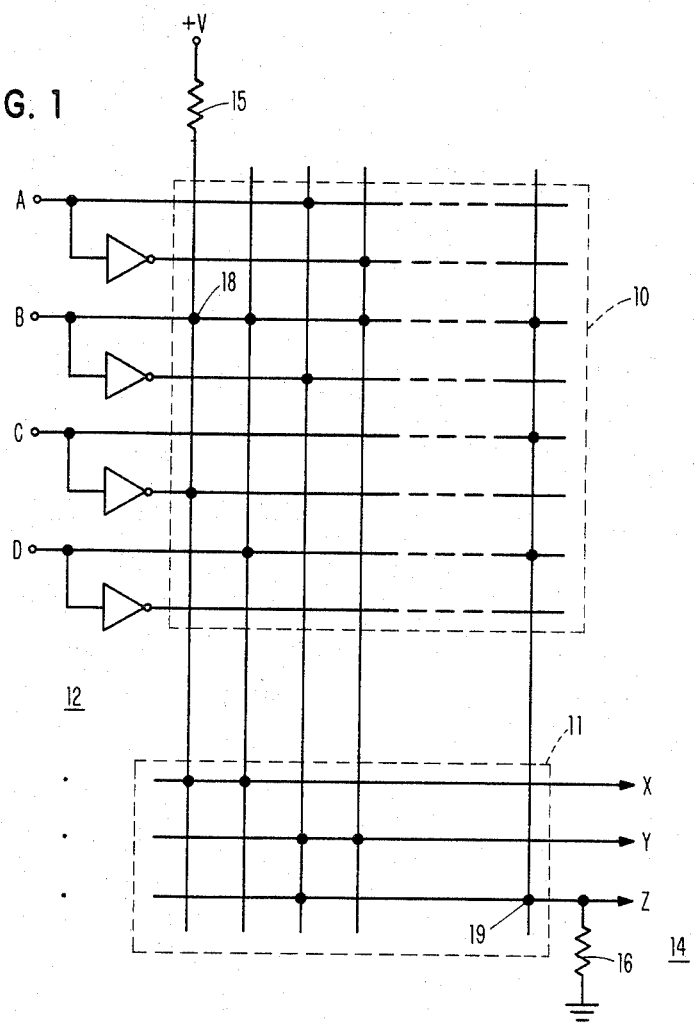
FIG. 1 is a schematic of an example of a programmed logic array.

A programmable logic array is a combination of connections between an AND-array and an OR-array as shown in FIG. 1. The AND-array 10 comprises input nodes 12 and term lines. The OR-array 11 comprises the term lines and output nodes 14.

Figure 2:
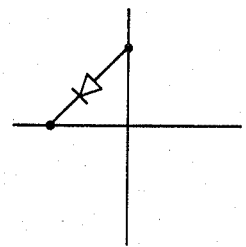
FIG. 2 is an example of an AND connection used in the PLA of FIG. 1.
Figure 3:
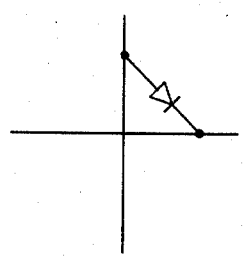
FIG. 3 is an example of an OR connection used in the PLA of FIG. 1.

The input lines to the AND-array 10 include both the true and the false input values. A desired input value is coupled to a term line as designated by a dot 18 at the intersection of the input and term lines. The connections in the AND-array 10 are made to impress an ANDed signal on the term line. By way of example, the term lines can be coupled through pull-up resistors to a logical high voltage such as shown by resistor 15 coupled to +V. The input-to-term line connections can then be made by diodes as shown in FIG. 2. All the input values so connected to a term line must be high for the term line to be high.

The output lines are coupled to the term lines, as indicated by a dot 19, to perform the OR function. As an example, a pull-down resistor 16 on the Z output line causes a voltage drop to a logical low level, and consequently, a high voltage at the output mode if any of the connected term lines is high. In the example of a PLA as shown in FIG. 1, the output values are X = B&(C'vD) = B&C'v B&D
Y = A@B = A&B'v A'&B
Z = A&B'v B&C&D where
  & signifies the AND operation,
  v signifies the OR operation,
  ' signifies the NOT operation, and
  @ signifies the Exclusive-OR operation.

Programmable logic arrays are constructed in many ways, depending on the technology. Arrays using transistors, both bipolar and field-effect, magnetic cores, and other devices are well known. The illustrative PLA of FIG. 1 is merely an example for descriptive purposes.

Figures 4, 5:
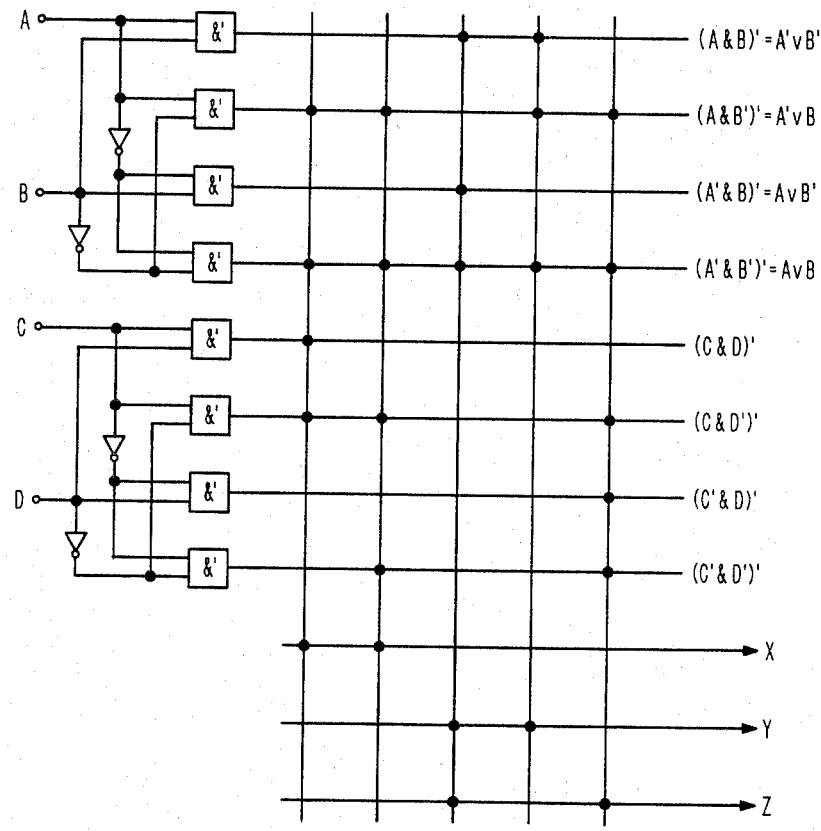
FIG. 4 is a tabular representation of the PLA of FIG. 1.
FIG. 5 is a schematic of a PLA using bit partitioning at the inputs.

FIG. 4 illustrates a tabular presentation of the PLA of FIG. 1 that is more conveniently constructed and conveys the same information as the PLA schematic. The first four columns of the table of FIG. 4 are the input variables and the last three columns are the output variables. The rows represent the term lines. A "1" indicates that the true value of the associated variable in the column is coupled to the term line and a "0" indicates that the false, or inverted, value is coupled to the term line. An "X" indicates the "don't-care" condition, i.e., no connection, which does not affect the term line condition. In the OR-array—the right three columns of FIG. 4—no connection is designated by a "0". The tabular representation provides the same information as a schematic, but in a more concise format.

The efficiency of a PLA can be improved by the addition of bit partitioning to the input lines. This is illustrated in FIG. 5. The input lines to the AND array are the combinations of pairs of input variables. The example shows a bit partitioning by decoding the variables two at a time using NAND gates, but in the general case, any number of variables can be decoded. Furthermore, the decoding gates can be other than NAND gates. For example, the use of NOR gates is popular in bit partitioning. The output variables have the same relationship to the input variables as the example PLA of FIG. 1.

Flip-flops are well known in the digital circuit art, and the most commonly used types are Set-Reset (SR), Data (D), Triggerable or Toggle (T), J-K type, and Set-Reset-Toggle (SRT). The operation of these various types of flip-flop are described in detail in U.S. Pat. No. 3,588,545. Other, less common types include input logic functions such as ANDED polarity hold (holding), ANDED polarity hold (sampling), Exclusive-OR hold (holding), Exclusive-OR polarity hold (sampling), and Gated polarity hold.

Each type of flip-flop usually has a dominant input. Normally, the SR type has no dominant or overriding input, the simultaneous activation of both inputs having an unpredictable effect on the output signal. (Exactly simultaneous flip-flop input signals usually do not exist.) The J-K type flip-flop usually has a dominant trigger mode, i.e., simultaneous activation of the J and K inputs results in the flip-flop acting as a T-type flip-flop.

Depending on the use of the flip-flop, however, it is often desirable to make one of the input signals dominant. This can be done using the teachings of this invention.

Figure 6:
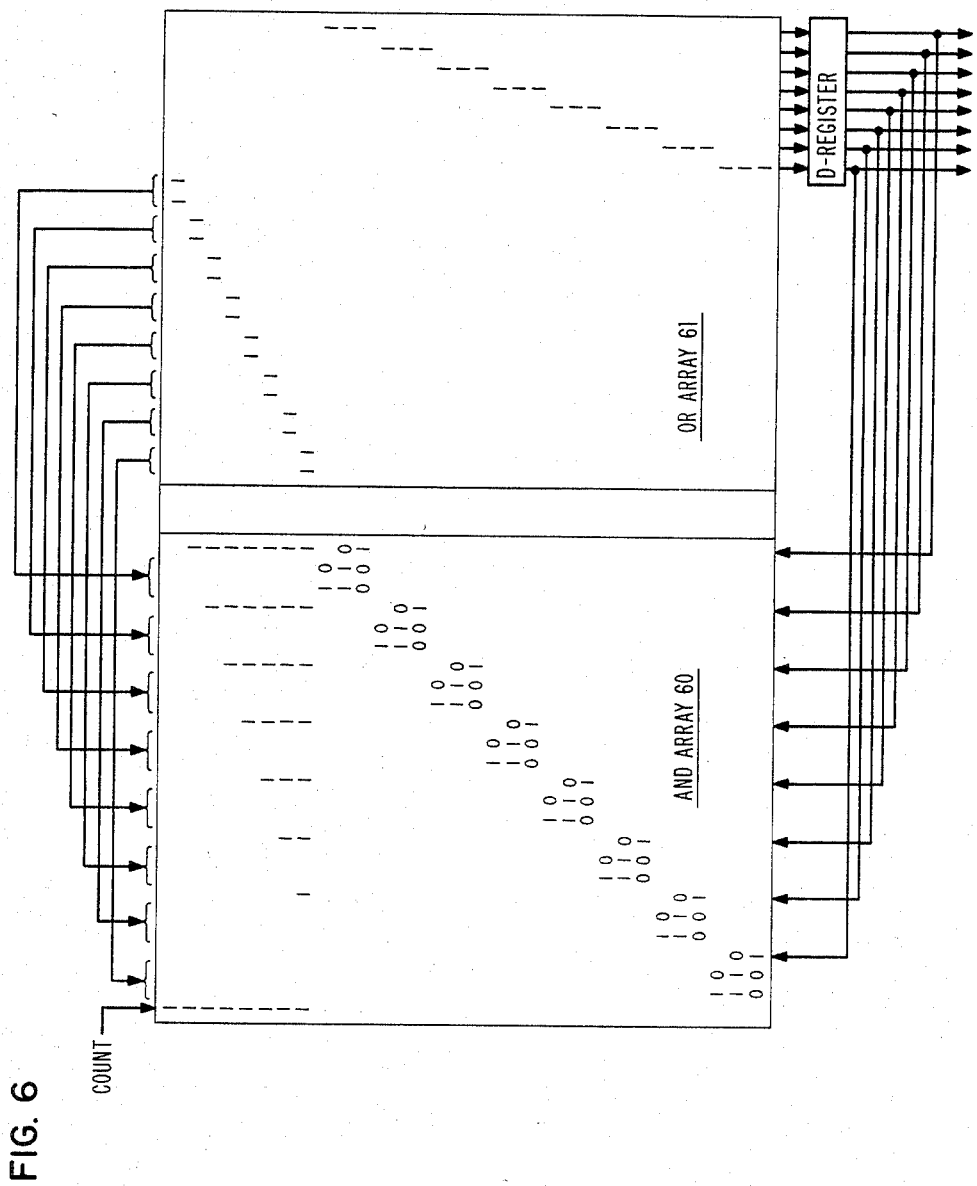
FIG. 6 is a schematic of a binary counter array constructed with a single PLA.
Figure 7:
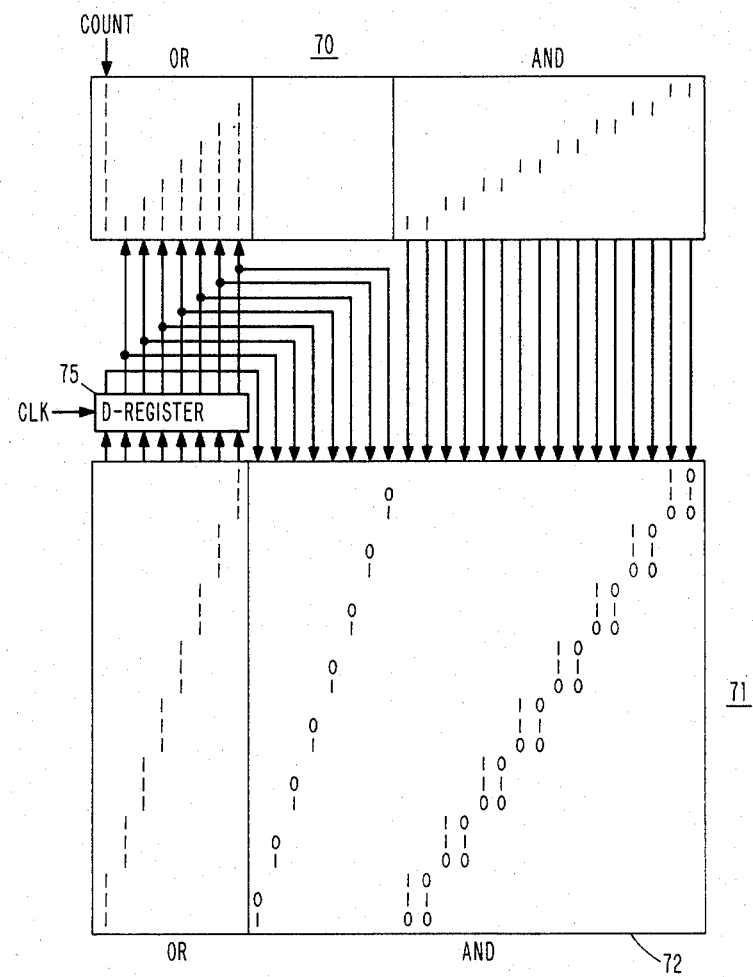
FIG. 7 is a schematic of the binary counter of FIG. 6 implemented with cascaded PLA's according to the invention.

As an example, the advantages of using cascaded PLA's to implement a J-K counter using D-type flip-flops over performing the same function with a single PLA are seen by comparing the single array configuration of FIG. 6 with the cascaded array configuration according to the teachings of the invention as shown in FIG. 7.

In the single array implementation of FIG. 6, the topmost seven rows of the AND-array 60 incorporate the binary counter function as if the J-K flip-flops were available. The leftmost 16 columns of the OR-array 61 incorporate the eight J-K latch control input pairs which drive the counter. These latch control signals are fed back into the AND-array 60. The eight counter-output state bits, from the topmost seven rows of the OR-array 61, are also fed back into the AND-array 60.

The bottom 24 word lines of the OR-array 61 use the aforementioned two sets of signals to generate D-type flip-flop input signals for the D-type registers actually available.

The single implementation array uses 1568 units of area, derived by multiplying 25 input nodes times 32 word lines for the AND-array 60 and adding the result to the product of 32 word lines times 24 output nodes for the OR-array 61. By comparison, it can be seen that the cascaded arrays implementation of FIG. 7 uses a total of 960 units of area, less than two-thirds the area used by the single array implementation.

The cascaded array of FIG. 7 has a main array 70 and a latch array 71. The savings in area are due to the different shapes of the main and latch arrays. Specifically, the main array 70 may generally be expected to contain many more word lines than the latch (control) array 71, which has few word lines but many input and output nodes.

Figure 8:
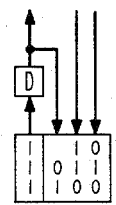
FIG. 8 is a block diagram of an individual D-latch control array.

Even greater savings in area are achieved by dividing the common latch array 71 into individual arrays, one for each D-register output. In the example, eight individual arrays of twelve units area would be used. The total resulting area would be 308 units, about one-fifth the area of the single PLA arrangement. An example of a single-bit array is shown in FIG. 8. There is also an operating speed advantage using the individual arrays.

The AND-array 72 of the latch array 71 receives input signals not only from the main array OR-output but also feedback from all the output latches 75. Therefore, the latch array 71 usually has a much smaller length-to-width ratio, i.e., array column length to array row length, than does the main array. The array shape differences discussed above become more significant when main array size greatly exceeds the latch array size, which is to be expected in the case for large PLA's. As a result, the 62% area penalty of the single array implementation can be even greater for larger array designs.

Besides the area penalty, a single array implementation has a speed penalty as well. Chip architectures incorporating the main array and the latch (control) array would best be done on-chip, with the main array OR outputs flowing directly into the latch array AND inputs. Latch output signals would be fed back into the latch-control array as on-chip feedbacks. Single array chips might not have enough on-chip feedback lines to accommodate both the latch outputs and all of the OR-array latch-control lines so that module output and input pins might have to be used for external feedback, reducing a module resource. Also, driving off-chip signal paths is usually significantly slower than driving signals on a chip or within a module. It would probably not be possible to clock the single array, external feedback path architecture as fast as the dual array, on-chip feedback architecture.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for implementing any given flip-flop circuit comprising, in combination:
   flip-flop means of at least one type having input means and output means;
   first and second logic array means having input means and output means for supplying as signals at their output means selective logic derivations of signals applied to their input means;
   means for coupling said output means of said second array means to the input means of said flip-flop means;

means for coupling said output means of said flip-flop means to said input means of the first and second logic array means; and means for coupling said output means of said first logic array means to the input means of said second logic array means.

2. A logic system comprising:

a plurality of flip-flop means having input means and output means and clock signal receiving means for supplying at said output means sequential count values in response to active signals at said clock signal receiving means;

first programmable logic array means comprising OR-array means arranged to receive input signals and AND-array means arranged to supply output signals;

second programmable logic array means comprising AND-array means arranged to receive input signals and OR-array means arranged to supply output signals;

means for coupling said output means of said plurality of flip-flop means as input signals to said first programmable logic array means;

means for coupling said output means of said plurality of flip-flop means as subset of said input signals to said second programmable logic array means;

means for coupling said output signals from said first programmable logic array means as a disjoint subset of input signals to said second programmable logic array means; and means for coupling said output signals from said second programmable logic array means to said input means of said plurality of flip-flop means.

3. The invention as claimed in claim 2 further comprising:

means for coupling a control signal as one of the input signals to said first programmable logic array means.

* * * * *